(12) United States Patent
Nidhi et al.

(10) Patent No.: US 9,911,815 B2
(45) Date of Patent: Mar. 6, 2018

(54) EXTENDED-DRAIN STRUCTURES FOR HIGH VOLTAGE FIELD EFFECT TRANSISTORS

(71) Applicant: INTEL CORPORATION, Santa Clara, CA (US)

(72) Inventors: Nidhi Nidhi, Hlllsboro, OR (US); Chia-Hong Jan, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/126,812

(22) PCT Filed: Jun. 18, 2014

(86) PCT No.: PCT/US2014/042925
§ 371 (c)(1),
(2) Date: Sep. 16, 2016

(87) PCT Pub. No.: WO2015/195116
PCT Pub. Date: Dec. 23, 2015

(65) Prior Publication Data
US 2017/0092726 A1    Mar. 30, 2017

(51) Int. Cl.
*H01L 29/40* (2006.01)
*H01L 29/78* (2006.01)
(Continued)

(52) U.S. Cl.
CPC ...... *H01L 29/402* (2013.01); *H01L 21/26513* (2013.01); *H01L 23/66* (2013.01);
(Continued)

(58) Field of Classification Search
CPC ... H01L 29/402; H01L 29/401; H01L 29/408; H01L 29/66545; H01L 29/1083; H01L 29/7816; H01L 29/66681; H01L 23/66
See application file for complete search history.

(56) References Cited

U.S. PATENT DOCUMENTS 5,907,173 A * 5/1999 Kwon ................... H01L 29/402
257/336
2003/0107081 A1 6/2003 Lee et al.
(Continued)

OTHER PUBLICATIONS

International Preliminary Report on Patentability, dated Dec. 29, 2016, for PCT Patent Application No. PCT/US14/42925.
(Continued)

*Primary Examiner* — Benjamin Sandvik
*Assistant Examiner* — Farid Khan
(74) *Attorney, Agent, or Firm* — Green, Howard, Mughal LLP

(57) ABSTRACT

Planar and non-planar field effect transistors with extended-drain structures, and techniques to fabricate such structures. In an embodiment, a field plate electrode is disposed over an extended-drain, with a field plate dielectric there between. The field plate is disposed farther from the transistor drain than the transistor gate. In a further embodiment, an extended-drain transistor has source and drain contact metal at approximately twice a pitch, of the field plate and the source and/or drain contact metal. In a further embodiment, an isolation dielectric distinct from the gate dielectric is disposed between the extended-drain and the field plate. In a further embodiment, the field plate may be directly coupled to one or more of the transistor gate electrode or a dummy gate electrode without requiring upper level interconnection. In an embodiment, a deep well implant may be disposed between a lightly-doped extended-drain and a
(Continued)

substrate to reduce drain-body junction capacitance and improve transistor performance.

21 Claims, 9 Drawing Sheets

(51) Int. Cl.
    *H01L 29/10*     (2006.01)
    *H01L 29/66*     (2006.01)
    *H01L 21/265*     (2006.01)
    *H01L 23/66*     (2006.01)

(52) U.S. Cl.
    CPC ........ *H01L 29/1083* (2013.01); *H01L 29/401* (2013.01); *H01L 29/408* (2013.01); *H01L 29/66545* (2013.01); *H01L 29/66681* (2013.01); *H01L 29/7816* (2013.01)

(56) References Cited

U.S. PATENT DOCUMENTS

| | | | |
|---|---|---|---|
| 2005/0156234 A1* | 7/2005 | Gammel | H01L 29/402 257/335 |
| 2006/0113601 A1* | 6/2006 | Shibib | H01L 29/402 257/365 |
| 2006/0286741 A1* | 12/2006 | Pan | H01L 27/0629 438/238 |
| 2008/0003703 A1* | 1/2008 | Gammel | H01L 29/402 438/10 |
| 2008/0067586 A1* | 3/2008 | Williams | H01L 21/761 257/335 |
| 2009/0256212 A1* | 10/2009 | Denison | H01L 29/0653 257/408 |
| 2010/0163936 A1* | 7/2010 | Immorlica | H01L 29/66462 257/284 |
| 2012/0098062 A1 | 4/2012 | Pendharkar et al. | |
| 2012/0175679 A1* | 7/2012 | Marino | H01L 29/402 257/194 |
| 2012/0228704 A1* | 9/2012 | Ju | H01L 29/402 257/339 |
| 2013/0146973 A1* | 6/2013 | Mitra | H01L 29/66719 257/335 |
| 2013/0181285 A1* | 7/2013 | Ng | H01L 29/402 257/335 |
| 2014/0232207 A1* | 8/2014 | Lee | H04B 5/0031 307/151 |

OTHER PUBLICATIONS

Office Action issued for Taiwan Patent Application No. 104115019, dated Mar. 24, 2016.

International Search Report and Written Opinion, dated Mar. 16, 2015, for PCT Patent Application No. PCT/US14/42925.

* cited by examiner

EXTENDED-DRAIN STRUCTURES FOR HIGH VOLTAGE FIELD EFFECT TRANSISTORS

CLAIM OF PRIORITY

This Application is a National Stage Entry of, and claims priority to, PCT Application No. PCT/US14/42925, filed on 18 Jun. 2014 and titled "EXTENDED-DRAIN STRUCTURES FOR HIGH VOLTAGE FIELD EFFECT TRANSISTORS", which is incorporated by reference in its entirety for all purposes.

TECHNICAL FIELD

Embodiments of the invention generally relate to fabrication of monolithic integrated circuits (ICs), and more particularly pertain to extended-drain structures for high voltage transistors.

BACKGROUND

Monolithic ICs generally comprise a number passive devices, such as resistors, and/or active devices, such as metal-oxide-semiconductor field-effect transistors (MOSFETs), or the like, fabricated over a substrate. Current system on a chip (SoC) technologies are focused on aggressively scaling the FET gate length ($L_g$) to provide performance and area scaling in accordance with Moore's Law.

One adverse effect of lateral scaling is that the support for low leakage and high voltage devices, both of which are important in SoC applications, becomes more difficult due to the architecture of high voltage transistors diverging from that of the minimum design-rule (nominal) logic transistor. Lateral scaling also reduces gate-contact spacing, which increases the peak electric field, further reducing a transistor's high voltage operating window.

A device architecture which enables some transistors to have a larger gate-drain spacing and/or to withstand higher breakdown voltages for a given gate-drain separation is advantageous for complex monolithic SOC IC designs.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figures 1A, 1B:
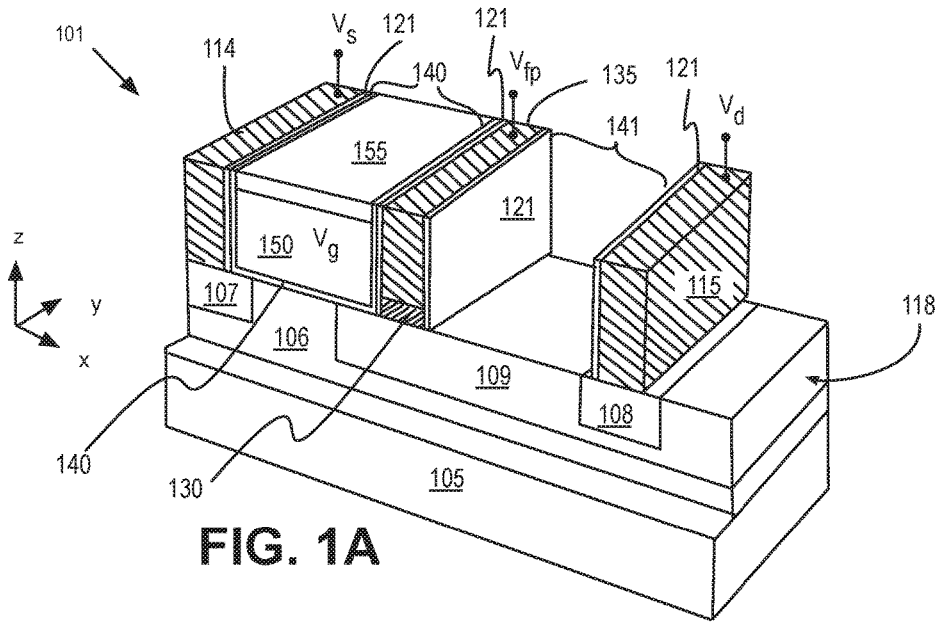
FIG. 1A is an isometric view of a planar transistor with an extended-drain in accordance with an embodiment.
FIGS. 1B and 1C are isometric views of non-planar transistors with an extended-drain in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or to "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Planar and non-planar field effect transistors with extended-drain structures, and techniques to fabricate such structures, are described herein. In an embodiment, a field plate electrode is disposed over an extended-drain. A field plate dielectric is between the field plate electrode and the extended-drain laterally is disposed farther from the transistor drain than the transistor gate. In a further embodiment, an extended-drain transistor has source and drain contact metal at twice a minimum contact metal pitch, with the field plate disposed at the minimum contact metal pitch relative to the source and drain contact metal. In other words, a source contact may be at a minimum contact metal pitch relative to a gate electrode, while the drain contact is at twice the minimum contact pitch with the field plate disposed at the minimum contact metal pitch on a side of the gate electrode opposite the source contact. In a further embodiment, an isolation dielectric distinct from the gate dielectric is disposed between the extended-drain and the field plate to set a desired electric field strength within the extended-drain. In a further embodiment, the field plate may be directly connected to one or more of the transistor gate electrode or a dummy gate electrode without requiring upper level interconnection. In an embodiment, a deep well implant may be disposed between a doped extended-drain and a substrate to reduce drain-body junction capacitance and improve transistor performance.

In an embodiment, a transistor includes a field plate electrode disposed over an extended-drain region. Between the field plate electrode and the extended-drain region is a field plate dielectric, which is disposed in closer proximity to the gate electrode than to the drain electrode. For high voltage devices having a field plate structure in this position, peak electric field at the drain edge of the gate electrode may be reduced, and drive current degradation due to hot carrier effects mitigated. FIG. 1A is an isometric view of a planar transistor 101 with an extended-drain in accordance with one such embodiment. FIG. 1B, is an isometric view of a non-planar transistor 102 with an extended-drain in accordance with another embodiment. Although a planar semiconductor body 118 is exemplified in FIG. 1A, extended-drain structures described herein may also be implemented with non-planar transistors in substantially the same manner. For example, non-planar transistor 102 illustrated in FIG. 1B includes all the extended-drain and field plate attributes and/or features of planar transistor 101 to illustrate how such features may be adapted to the geometry of a non-planar semiconductor body 118. As further shown in FIG. 1B, each of a plurality of non-planar semiconductor bodies 118 pass through an isolation dielectric 120 disposed over substrate 105. Ganging of non-planar semiconductor bodies 118 in non-planar transistor 102 facilitates larger drive currents that might be utilized in high voltage applications, but a single non-planar semiconductor body 118 may be employed as well.

In reference to both FIGS. 1A and 1B, semiconductor body 118 is disposed over a substrate 105. Substrate 105 may be any substrate suitable for forming a monolithically integrated electrical, optical, or microelectromechanical (MEM) device, generally referred to herein as an IC. Exemplary substrates include a semiconductor substrate, semiconductor-on-insulator (SOI) substrate, an insulator substrate (e.g., sapphire), or the like, and/or combinations thereof. In one exemplary embodiment, substrate 105 comprises a substantially monocrystalline semiconductor, such as, but not limited to, silicon. Exemplary semiconductor substrate compositions also include germanium, or group IV alloy systems, such as SiGe; group III-V systems, such as GaAs, InP, InGaAs, and the like; or group III-N systems, such as GaN. Semiconductor body 118 may be of the same substantially monocrystalline semiconductor as substrate 105 (e.g., silicon).

Semiconductor body 118 includes a source region 107 at a first end in direct physical contact with a source contact metal 114. For non-planar embodiments, source contact metal 114 may wrap around the non-planar semiconductor body (e.g., completely surround an axial length in a nanowire embodiment). Semiconductor body 118 further includes a drain region 108 at a second end in physical contact with a drain contact metal 115. For non-planar embodiments, drain contact metal 115 may wrap around the non-planar semiconductor body (e.g., completely surround an axial length in a nanowire embodiment). Depending on the conductivity type of the transistor, source and drain regions 107, 108 may be doped either n-type (e.g., NMOS) or p-type (e.g., PMOS). In embodiments, the source contact metal 114 and drain contact metal 115 have substantially the same composition, such as, but not limited to copper (Cu), cobalt (Co), tungsten (W), titanium (Ti), aluminum (Al), platinum (Pt), nickel (Ni), their alloys, and silicides, carbides, and germanides thereof. In the exemplary embodiment illustrated, top surfaces of source, drain contacts 114, 115 are substantially planar with each other (e.g., to with 10% of a same z-height).

Semiconductor body 118 further includes a channel region 106 disposed between source region 107 and an extended-drain region 109. Channel region 107 is semiconductor that may be substantially undoped (e.g., not intentionally doped), or may be lightly doped to a type complementary to the source/drain regions (e.g., p-type channel region for an NMOS FET, n-type channel region for a PMOS FET). Extended-drain region 109 is a semiconductor region doped to the same conductivity type as the source and drain regions 107, 108 (e.g., n-type for NMOS). Extended-drain region 109 is referred to herein as "lightly-doped" as it is doped more lightly than is drain region 108. In one exemplary NMOS embodiment, extended-drain region 109 is doped n-type to $10^{16}$ cm$^{-3}$-$10^{20}$ cm$^{-3}$. Extended-drain 109 accordingly increases the spacing between channel and drain regions, dropping along its lateral length (e.g., x-dimension) the electric field resulting from a voltage differential between voltage potential $V_g$ of gate electrode 150 and voltage potential $V_d$ of drain region 108. The shape of the electric field within the extended-drain 109 can be modulated by the field effect through field plate dielectric 130 as a function of voltage potential $V_{fp}$ of field plate electrode 135. As shown, each of $V_g$, $V_s$, $V_d$, and $V_{fp}$ may be configured for independent biasing during operation of extended-drain transistor 101. In further embodiments described elsewhere herein, transistor structure may be modified to directly connect field plate electrode 135 to another terminal of the device (e.g., gate electrode 150) so that field plate electrode 135 does not necessarily increase interconnect terminal count for the device.

Field plate electrode 135 is disposed over at least a portion of extended-drain region 109 and is electrically isolated from underlying semiconductor by field plate dielectric 130. Field plate electrode 135 is further electrically isolated from gate electrode 150 by at least dielectric spacer 121, and depending on the fabrication techniques employed, may be further isolated by gate dielectric 140, as is illustrated in FIG. 1A. Dielectric spacer 121 may be any known dielectric material, such as, but not limited to, silicon oxides (SiO), silicon nitrides (SiN), silicon oxynitrides (SiON), silicon carbonitrides (SiCN), or low-k materials (e.g., carbon doped silicon dioxide (SiOC), porous dielectrics, etc.). Dielectric spacer 121 is of a nominal thickness, for example, 20 nm, or less, in advanced CMOS technology. Similarly, gate dielectric 140 may be any known dielectric material, such as, but not limited to, silicon oxides (SiO), silicon nitrides (SiN), silicon oxynitrides (SiON), silicon carbonitrides (SiCN), or any high-k material (e.g., such as $HfO_2$, metal silicate, or the like). Gate dielectric 140 is of a nominal thickness dependent upon its bulk relative permittivity to achieve a desired equivalent oxide thickness (EOT), for example, 10 nm, or less (e.g., 5 nm), in advanced CMOS technology.

In embodiments, field plate dielectric 130 has a different EOT than gate dielectric 140 disposed between channel region 106 and gate electrode 150. EOT may be varied to tune electric field shape within extended-drain region 109 proximate to the drain edge of gate electrode 150. To achieve a difference in EOT, either or both material composition and film thickness may be varied independently of that of gate dielectric 140. In embodiments, field plate dielectric 130 has a thickness (as measured between nearest surfaces of field plate electrode 135 and extended-drain 109), which is different than that of gate dielectric 140 (as measure between nearest surfaces of gate electrode 150 and channel region 106). In certain embodiments, field plate dielectric 130 has a thickness significantly greater than that of gate dielectric 140. In advantageous embodiments, field plate dielectric 130 has an EOT 3-10 times thicker than that of gate dielectric 140. In specific examples where field plate dielectric 130 has a bulk dielectric constant of 8, or less, field plate dielectric 130 has a physical thickness ranging from 15-50 nm.

In an exemplary embodiment, field plate dielectric 130 has a composition distinct from gate dielectric 140. In advantageous embodiments, field plate dielectric is of a material having a lower dielectric constant than that of gate dielectric 140. Lower relative permittivity may reduce the field effect of field plate electrode 135 at any given voltage $V_{fp}$. In advantageous embodiments, field plate dielectric 130 is of a material having a dielectric constant less than 3.5, and more advantageously less than 3.0. Exemplary low-k materials include, but are not limited to, carbon doped silicon dioxide (SiOC), and porous dielectrics. In certain embodiments, for example where $V_{fp}$ is tied to gate electrode voltage $V_g$, field plate dielectric 130 has both a reduced relative permittivity (i.e., low-k) and an increased dielectric thickness relative to gate dielectric 140.

Field plate electrode 135 may be of any material of suitable conductivity. In advantageous embodiments, field plate electrode 135 is of a different composition than gate electrode 150. The distinct composition may enable selection of a material having a different workfunction than that of gate electrode 150. Modulation of field plate electrode work function may be another means of targeting a specific electric field shape within extended-drain 109, in addition to control of composition and thickness of field plate dielectric 130. Exemplary materials for field plate electrode 135 include polycrystalline semiconductor (e.g., polysilicon) doped to a desired conductivity type, and/or one or more metals (i.e., alloys). In one advantageous embodiment, field plate electrode 135 has the same composition as at least one of source contact metal 114 and drain contact metal 115. In certain such embodiments field plate electrode has the same composition as both the source and drain contact metals 114, 115. Field plate electrode 135 may therefore include a metal of any composition known to provide ohmic contact to source and drain regions 107, 108, and more specifically may include any of the metals described above for contact metals 114, 115. In further embodiments, a top surface of field plate electrode 135 is substantially planar with a top surface of source contact 114 and substantially planar with a top surface of drain contact 115.

As further illustrated in FIG. 1A, gate electrode 150 is disposed over the channel region 106, and may further overlap a portion of extended-drain 109. Gate electrode 150 may be of any material providing a suitable work function for the conductivity type of transistor 101. For example, gate electrode composition may vary to accommodate various work function targets by including a desired workfunction metal, or by doping a gate electrode composed of a semiconductor such as polysilicon. A capping dielectric 155 is disposed over gate electrode 150, which may provide electrical isolation over a top surface of gate electrode 150 and, in the exemplary embodiment, substantially planarizes the gate stack with source contact metal 114, drain contact metal 115, and field plate electrode 135. Gate capping dielectric 155 may be of a composition distinct from one or more of gate dielectric 140, spacer dielectric 121, or field plate dielectric 130, allowing for any desired etch selectively between the materials. In exemplary embodiments, gate capping dielectric 155 includes one or more of: SiO, SiON SiN, SiCN, SiC, low-k dielectric (e.g., carbon-doped oxide), or the like.

As further illustrated in FIG. 1A, field plate dielectric 130 and field plate electrode 135 are laterally spaced apart (e.g., in x-dimension) from gate electrode 150 by the nominal thickness of spacer 121, and potentially further spaced apart by gate dielectric 140, each of which in exemplary embodiments is less than 10 nm Field plate dielectric 130 and field plate electrode 135 are laterally spaced apart from drain contact 115 by at least two nominal thicknesses of spacer 121, a first spacer 121 being disposed on the drain side of field plate 135 and another spacer 121 being disposed on the gate side of drain contact metal 115. Additionally, field plate dielectric 130 and field plate electrode 135 are laterally spaced apart from drain contact 115 by a non-zero lateral spacing 141. While extended-drain 109 extends along the lateral spacing 141, at least one of field plate dielectric 130 or field plate electrode 135 is absent from this region. As such, at least one of field plate dielectric 130 or field plate electrode 135 is disposed in closer proximity to gate electrode 150 than to the drain contact metal 115.

Figure 1C:
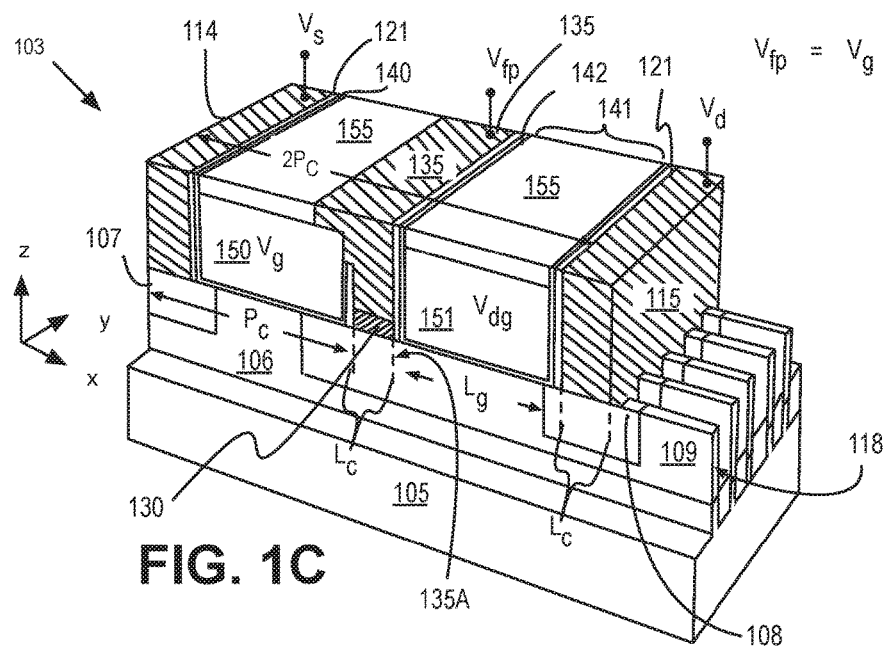

FIG. 1C is an isometric view of a non-planar extended-drain transistor 103 with an extended-drain in accordance with a further embodiment. As illustrated, a dummy gate electrode 151 occupies lateral spacing 141. In the exemplary embodiment, dummy gate electrode 151 has substantially the same lateral gate length $L_g$ as gate electrode 150 (e.g., to within 10%). A drain edge of field plate dielectric 130 and field plate electrode 135 are therefore spaced apart from the drain contact metal 115 by at least one gate electrode lateral length $L_g$. For transistor 103, source contact metal 114 and field plate electrode 135 are at a contact metal pitch $P_c$, which in one example may be the nominal design rule pitch for low voltage logic transistor source/drain contacts. As contact dimensions and contact pitch scale with technology, these values can be expected to change over time, but an exemplary range of $P_c$ is 30-300 nm. For extended-drain transistor 103, source contact 114 and drain contact 115 are at approximately twice the pitch $P_c$. In other words, for extended-drain transistor 103, source contact metal 114 is spaced apart from drain contact metal 115 by at least twice a lateral length of gate electrode $L_g$. As gate dimensions and scale with technology, this value can be expected to change over time, but an exemplary range of $L_g$ is 10-180 nm More particularly, source contact metal 114 is spaced apart from drain contact metal 115 by twice $L_g$ in addition to the lateral length $L_c$ of extended-drain 109 occupied by the field plate stack (field plate dielectric 130 and field plate electrode 135), and any intervening dielectrics (e.g., dielectric spacer 121). In this exemplary embodiment, drain contact metal 115 also has a lateral length of approximately $L_c$. Source contact metal 114 may interface to source region 107 over the lateral length $L_c$ as well.

Dummy gate electrode 151 is disposed over extended-drain region 109 between gate electrode 150 and drain contact 115. Field plate electrode 135 is therefore disposed between gate electrode 150 and dummy gate electrode 151. In the exemplary embodiment, dummy gate electrode 151 is of the same composition as gate electrode 150 and is separated from semiconductor body 118 by a dummy gate dielectric 142. Dummy gate electrode 151 would be operable for gating if it was disposed over a channel region and properly biased. However, being positioned over extended-drain region 109, dummy gate bias voltage $V_{dg}$ may instead operate as another field plate to further modulate extrinsic resistance and electric field within extended-drain 109. In further embodiments, dummy gate dielectric 142 may be differentiated gate dielectric 140 by dielectric thickness and/or composition to be an effective field plate dielectric. For the structure illustrated in FIG. 1C, dummy gate electrode 151 is electrically isolated from gate electrode 150, although it may be interconnected to a circuit node external of transistor 103 that is further coupled to gate electrode 150 (or any terminal of transistor 103). Dummy gate electrode 151 is further capped with gate capping dielectric 155 to have a top surface substantially planar with field plate electrode 135, source contact metal 114, and drain contact metal 115.

In embodiments, a field plate electrode is electrically coupled to at least one of the gate electrode, dummy gate electrode, or source contact metal. For source connected field plate embodiments, the dummy gate electrode may also be tied to the source contact potential $V_s$, or left floating. Such coupling may be through interconnection external to the transistor terminals (i.e., upper level metallization). In certain embodiments, a field plate electrode is directly connected at the transistor-level to either or both of a gate electrode or a dummy gate electrode. In such embodiment, the dummy gate electrode may be further coupled through interconnection external to the transistor terminals, for example to be biased at the source potential $V_s$, while the field plate potential $V_{fp}$ is tied to the gate electrode potential $V_g$ by through direct connection. Alternatively, where there is a direct connection only between the field plate and the dummy gate electrode, the field plate potential $V_{fp}$ is tied to the dummy gate electrode potent $V_{dg}$, which may be controlled by an external connection, for example to $V_s$.

FIG. 1C illustrates one exemplary embodiment in which field plate electrode 135 is directly connected to gate electrode 150. In this configuration field plate voltage $V_{fp}$ will be substantially the same as gate voltage $V_g$ and one external terminal may be utilized to control both electrodes. As noted above however, because of compositional and structural differences, electrodes 135 and 150 may impart different field effects on their respective regions of semiconductor body 108. For example, relative permittivity and thickness of field plate dielectric 130 may be predetermined to provide a desired effect on field near the gate electrode edge of extended-drain 109 when biased at a particular gate voltage $V_g$. Direct contact between field plate electrode 135 and gate electrode 150 may be achieved through selective patterning and/or recessing of one or more of dielectric spacer 121, gate dielectric 140, or gate capping dielectric 155. In the exemplary embodiment, dielectric spacer 121 and gate dielectric 140 are both recessed relative to a top surface of gate electrode 150, exposing a sidewall of gate electrode 150. Gate capping dielectric 155 is also patterned to have a smaller lateral dimension than that of gate electrode 150 (i.e., smaller than $L_g$) so that field plate electrode 135 at least partially lands on gate electrode 150.

Figure 2A:
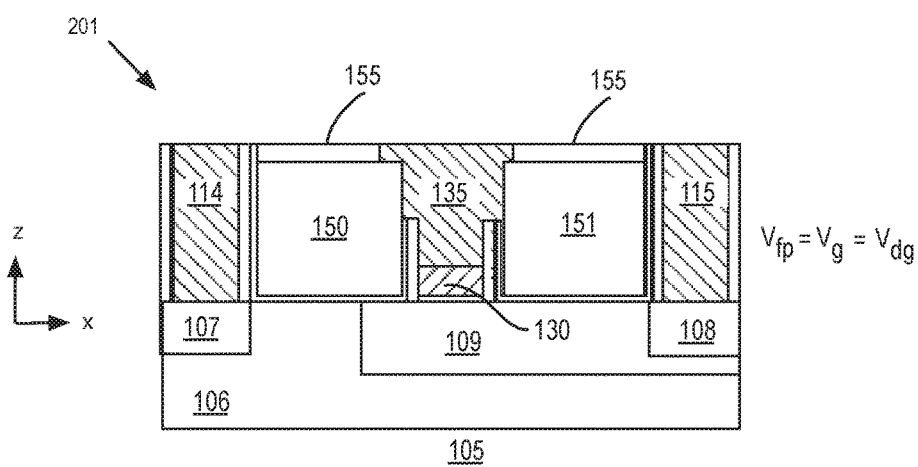
FIGS. 2A, 2B and 2C are cross-sectional views of transistors with extended-drain structures in accordance with embodiments.
Figure 2B:
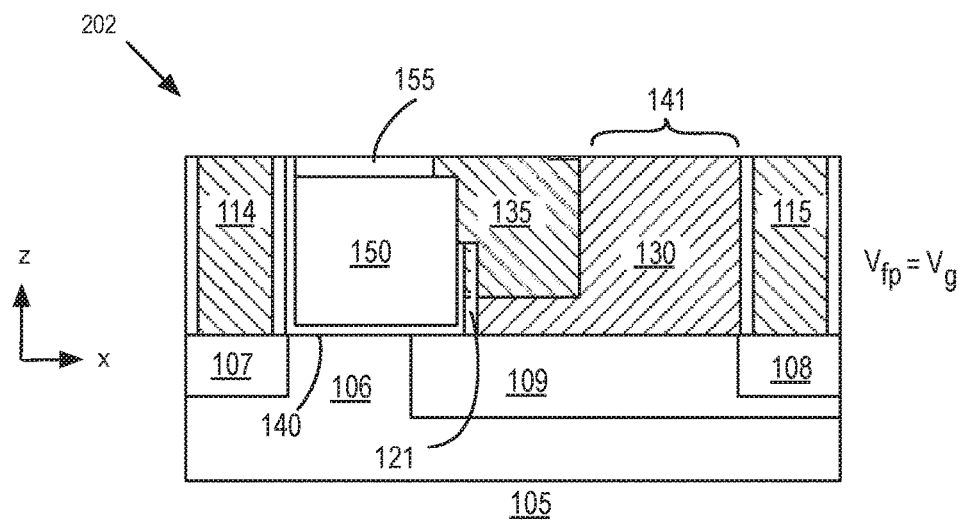
Figure 2C:
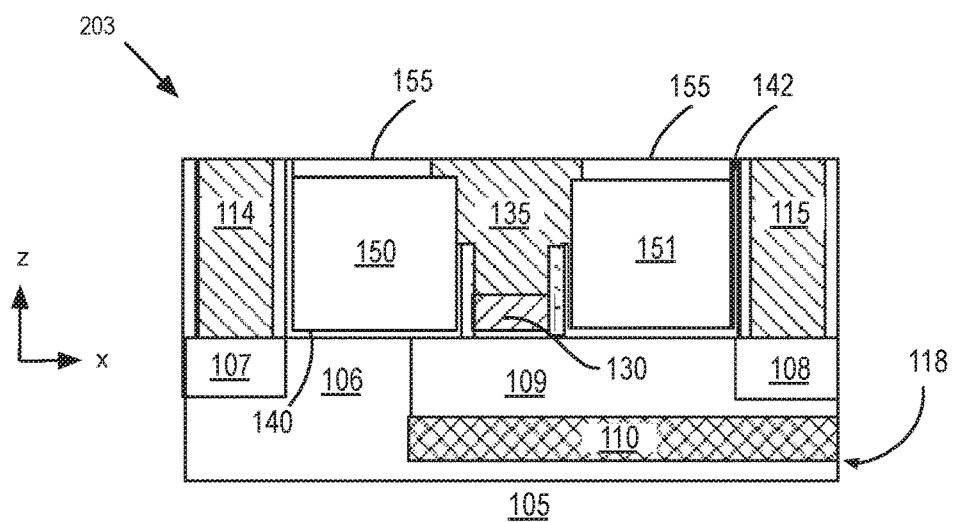

FIGS. 2A, 2B and 2C are cross-sectional views of transistors with extended-drain structures in accordance with further embodiments. These cross-sectional views correspond to the sectional view in FIG. 1A-1C and area applicable to both planar and non-planar transistor embodiments. Referring to FIG. 2A, extended-drain transistor 201 includes a field plate electrode 135 that is in direct contact with both gate electrode 150 and dummy gate electrode 151. For such an embodiment, gate bias voltage $V_g$, field plate bias voltage $V_{fp}$, and dummy gate bias voltage $V_{dg}$ are all tied together without any interconnection external to transistor 201. In this configuration, relative permittivity and thickness of field plate dielectric 130 may be predetermined for example to provide a desired effect on electric field within the gate electrode edge of extended-drain 109 when biased at a particular gate voltage $V_g$. The dummy gate dielectric can also be tuned in this configuration to further extend the field plate effect on the electric field in the extended-drain region. Biasing of dummy gate electrode 151 to the gate voltage $V_g$ will cause gradual electric field profile which will potentially increase the breakdown voltage of the transistor while maintaining high performance. This will also reduce time-dependent degradation effects caused by hot carriers in high electric field regions, thereby improving the lifetime of a high voltage device.

Referring to FIG. 2B, extended-drain transistor 202 includes an interlayer dielectric (ILD) disposed in the lateral spacing 141 between field plate electrode 135 and drain contact 115. In the exemplary embodiment, field plate dielectric 130 fills the lateral spacing 141 with a portion of field plate dielectric 130 recessed to accommodate field plate electrode 135 at a z-height from extended-drain 109 that provides a predetermined EOT. As further illustrated, field plate electrode 135 makes direct contact with gate electrode 150 for dependent biasing. In other embodiments however, field plate electrode 135 may be electrically isolated from gate electrode 150 by at least dielectric spacer 121 permitting independent field plate biasing.

In embodiments, an extended-drain transistor includes a lightly doped deep well in the semiconductor body disposed between the more heavily doped extended-drain region and a complementarily doped semiconductor. Such a well may be appropriately doped to reduce drain-body capacitance through a wider depletion width. Drain-body capacitance may otherwise be significant given the relatively larger lateral length of the extended-drain (i.e., larger junction area), and the moderate doping level of extended-drain that may otherwise constrained by another parametric, such as extrinsic resistance. Reduced drain-body capacitance may improve high voltage transistor transients (e.g., switching speed). Notably, deep well embodiments are not dependent upon further integration of a field plate and a deep well structure may reduce drain-body capacitance of any extended-drain transistor.

FIG. 2C illustrates an extended-drain transistor 203 including a deep doped well 110 disposed between extended-drain region 109 (e.g., n-type) and surrounding material of semiconductor body 118, which may be doped for example to the type of channel region 106 (e.g., p-type). For embodiments where semiconductor body 118 is a non-planar structure extending from semiconductor substrate 105, deep doped well 110 may be disposed at an interface of the non-planar body 118 and substrate 105 so that the deep doped well does not extend below isolation dielectric separating adjacent fins. In one embodiment, deep doped well 110 is doped to the same effective conductivity type as extended-drain region 109, but to a lower effective impurity concentration than extended-drain region 109. For example, deep doped well 110 may be doped to an impurity concentration at least one order of magnitude lower than that of extended-drain region 109. In one such embodiment where extended-drain region 109 is doped n-type to at least $10^{18}$ cm$^{-3}$, deep doped well 110 is doped n-type to below $10^{18}$ cm$^{-3}$.

In further embodiments, a deep doped well may be combined with a field plate electrode disposed over an extended-drain region, and/or combined with a field plate electrode coupling to the extended-drain region through a field plate dielectric having a greater EOT than a gate dielectric. As further illustrated in FIG. 2C for example, a field plate electrode 130 disposed closer to gate electrode 150 than drain contact 115 is separated from extended-drain region 109 by field plate dielectric 130 having a greater EOT than gate dielectric 140.

Figure 3:
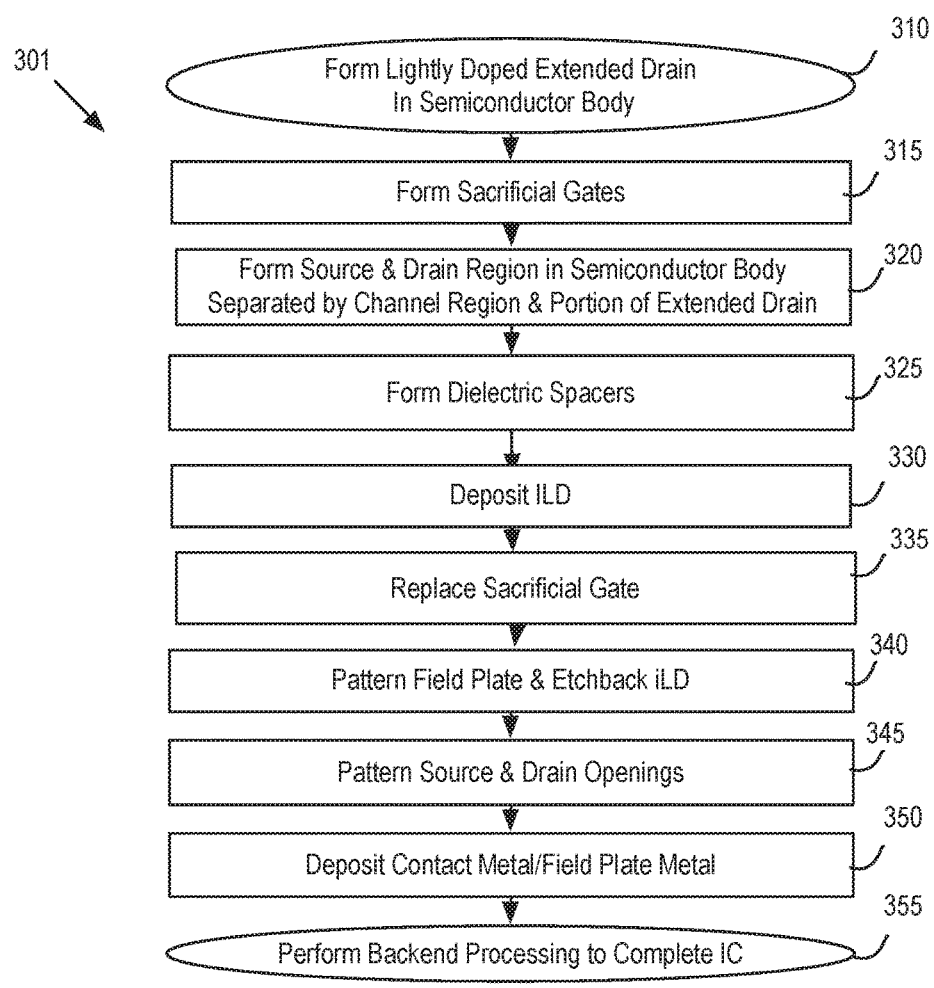
FIG. 3 is a flow diagram illustrating a method of forming a transistor with an extended-drain, in accordance with an embodiment.
Figure 4A:
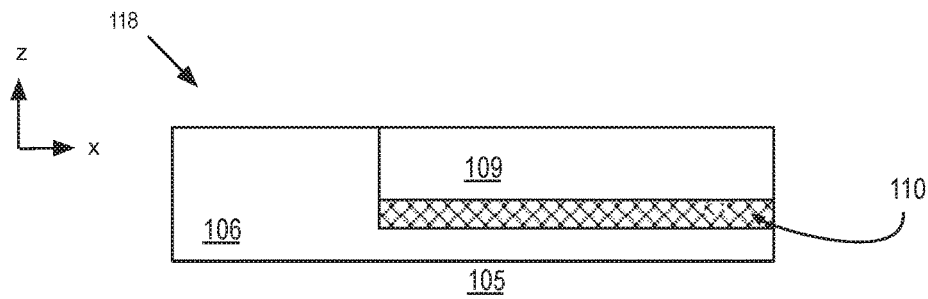
FIGS. 4A, 4B, 4C, 4D, 4E, 4F, 4G, and 4H are cross-sectional views of a transistor with an extended-drain structure evolving as selected operations in the method depicted in FIG. 3 are performed, in accordance with an embodiment.
Figure 4B:
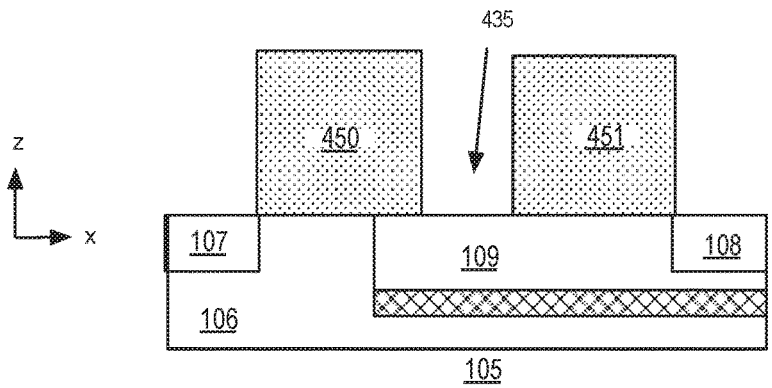
Figure 4C:
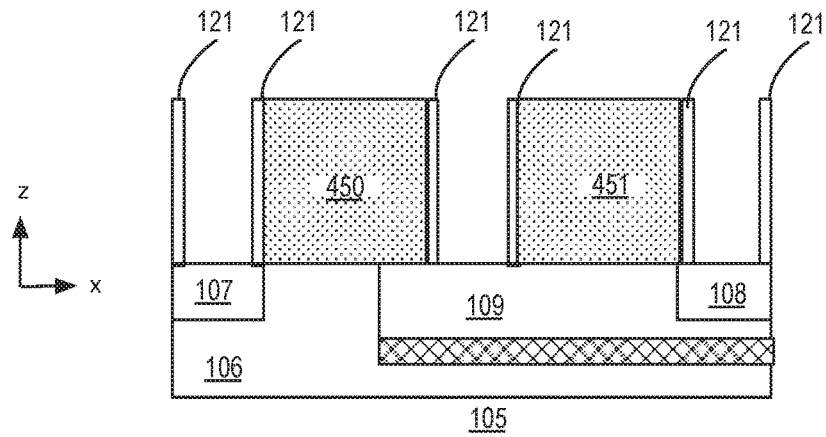
Figure 4D:
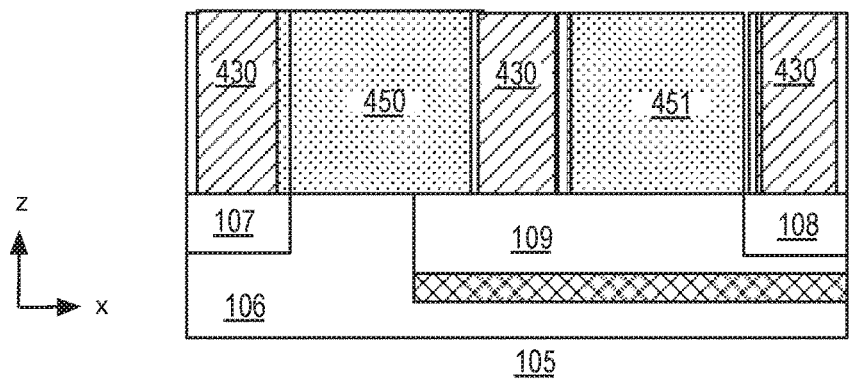
Figure 4E:
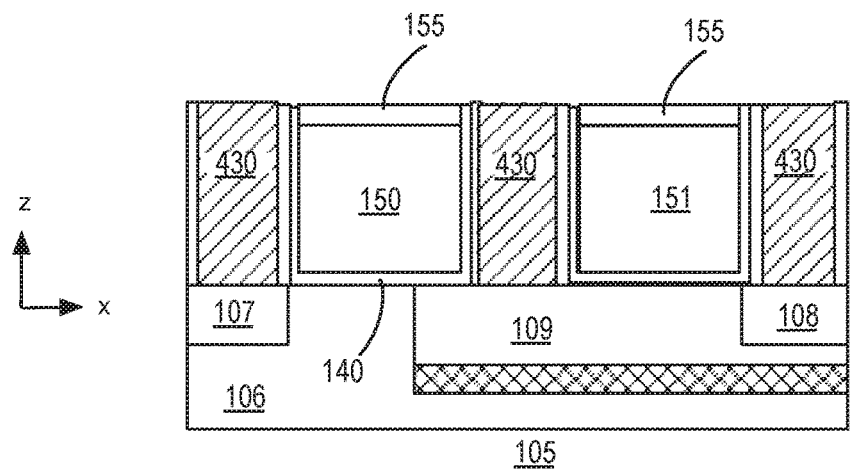
Figure 4F:
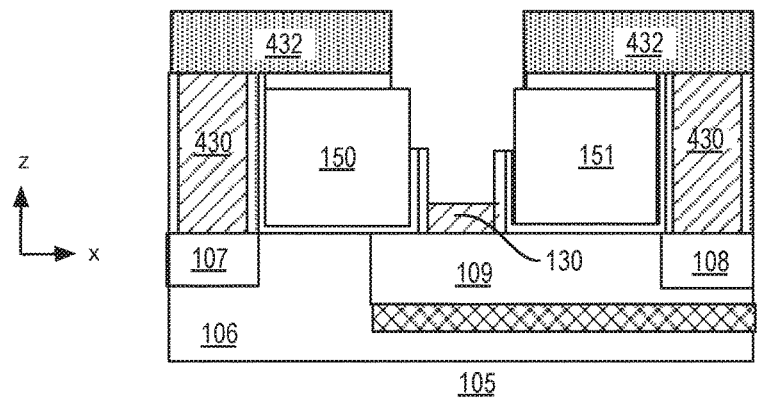
Figure 4G:
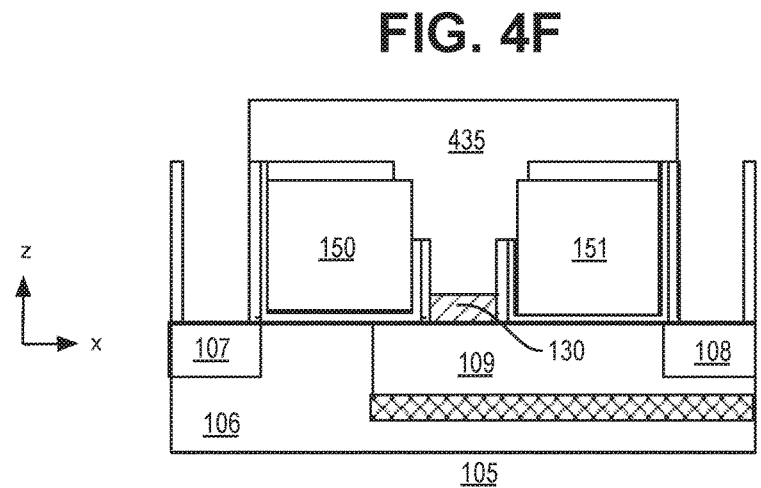
Figure 4H:
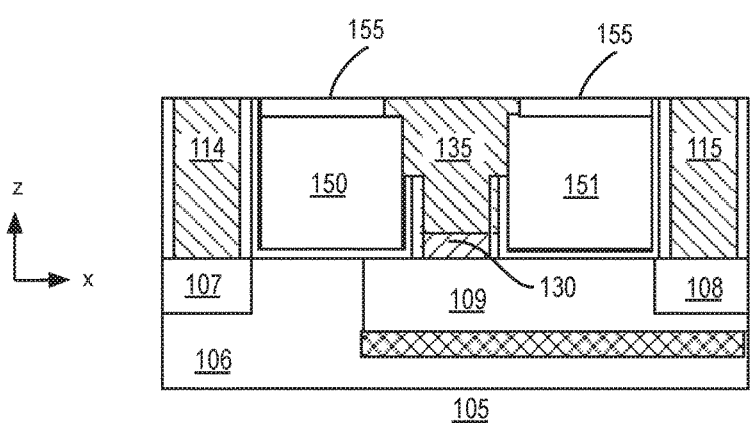

Field plate structures and extended-drain transistors incorporating them may be fabricated with a wide variety of techniques. FIG. 3 is a flow diagram illustrating a method 301 for forming an extended-drain transistor, in accordance with one exemplary embodiment. Unless specifically noted, the order of operations presented in method 301 is unimportant as one of ordinary skill may modify operation sequencing. Method 301 may be practiced to fabricate transistor 101 illustrated in FIG. 1A, or transistors 102, 102, 201, 202, or 203 illustrated in FIGS. 1B-1C, and 2A-2C, for example. Certain operations described in the context of method 301 are described in further detail in reference to FIG. 4A-4H, which are cross-sectional views of an extended-drain FET evolving as selected operations in method 301 are performed, in accordance with advantageous embodiments. Reference numbers introduced in FIGS. 1A, 1B, 1C, 2A, 2B, and 2C are retained for corresponding structures illustrated in FIG. 4A-4H.

Method 301 begins at operation 310 with forming a doped extended-drain region or well within a semiconductor body. A doped deep well may also be formed at operation 310. An input into operation 310 is a semiconductor body within an isolation dielectric disposed over a substrate. The body may be a non-planer "fin" etched into substrate or a planar surface of the substrate. The semiconductor body and substrate may be, for example, substantially monocrystalline silicon, or any other semiconductor material system suitable for formation of a transistor, such as any of those described above. An isolation dielectric disposed around the semiconductor body may have been deposited over the semiconductor body, and planarized with a top surface of semiconductor body, and then recessed using conventional techniques to expose a desired fin z-height.

Any doping process known to provide the desired well doping profile(s) may be utilized. For example, one or more ion implant processes may be performed at operation 310. In the example illustrated in FIG. 4A, semiconductor body 118 (planar or non-planar) having a first impurity type suitable for channel region 106 is masked and implanted with dopant species of the complementary type to form a doped deep well 110 and extended-drain region 109. Extended-drain region 109 may for example received a moderate dopant concentration, an order of magnitude or more less than that of a degenerate source/drain diffusion, while deep well 110 may have an order of magnitude lower impurity concentration than that of extended-drain region 109.

Returning to FIG. 3, a gate replacement process is performed beginning with sacrificial gate formation at operation 315. Sacrificial gates or gate stacks may be fabricated with any known technique. In one embodiment a sacrificial material, such as, but not limited to polysilicon is deposited over the substrate and patterned to form a plurality of sacrificial gate features in alignment with the extended-drain region of a semiconductor body. Any suitable deposition technique may be utilized, such as, but not limited to chemical vapor deposition (CVD), or atomic layer deposition (ALD). In one exemplary embodiment polysilicon is deposited by CVD. Any suitably anisotropic etch may be utilized to pattern the sacrificial material. At operation 320, source and drain regions are then formed in the semiconductor body, for example through ion implant, or a semiconductor etch and regrown, in alignment with a first sacrificial gate feature defining a channel region and a second sacrificial gate feature defining a lateral spacing between the drain region and a field plate to be subsequently fabricated. In the example illustrated in FIG. 4B, sacrificial gate structure 450 defines a separation between source 107 and extended-drain 109 and sacrificial gate structure 451 defines a lateral spacing between drain region 108 and an opening 435 between sacrificial gate structures 450 and 451.

Returning to FIG. 3, method 301 continues with formation of dielectric spacer(s) at operation 325. Any suitable dielectric material, such as, but not limited to SiO, SiON, SiN, SiOC, etc., may be deposited using any known technique, such as, but not limited to chemical vapor deposition (CVD), or atomic layer deposition (ALD). The deposition is advantageously conformal. An anisotropic etch may then clear the dielectric material leaving only spacer structures self-aligned to topographic steps. In the exemplary embodiment illustrated in FIG. 4C, dielectric spacers 121 are self-aligned to edges of sacrificial gate structures 450, 451.

Returning to FIG. 3, method 301 continues at operation 330 with deposition of a dielectric material around sacrificial gate structures 450, 451. In advantageous embodiments, the composition of the dielectric has a relative permittivity advantageous for a field plate dielectric. In one example, the dielectric deposition at operation 330 has a lower relative permittivity (i.e., low-k) than silicon dioxide, such as but not limited to, SiOC. Any deposition process may be employed at operation 330, such as, but not limited to, CVD, and spin-on processes. For deposition processes that are non-planarizing, the deposited dielectric may be planarized, for example by chemical-mechanical polish (CMP) to expose top surfaces of the sacrificial gate features. In the exemplary embodiment illustrated in FIG. 4D, dielectric 430 is deposited around and planarized with sacrificial gate structures 450, 451.

Returning to FIG. 3, method 301 continues at operation 335 with replacement of sacrificial gate structures with a gate stack including a gate dielectric over the channel region and gate electrode disposed over the gate dielectric. Any conventional etch process may be utilized to remove the sacrificial gate structures selectively to the surrounding dielectric and expose the channel region, such as, but not limited to a wet chemical etch, or dry plasma etch. Over the channel region a gate dielectric is deposited, for example with a deposition process such as, but not limited to, ALD. Over the gate dielectric one or more gate electrode material may be deposited by any known technique, such as, but not limited to, physical vapor deposition (PVD), CVD, or ALD, depending on the material deposited. If the deposition process is not self-planarizing, a planarizing process, such as CMP may be performed to expose top surfaces of dielectric. In the exemplary embodiment illustrated in FIG. 4E, gate electrode 150 and dummy gate electrode 151 are deposited over gate dielectric 140 (and a dummy gate dielectric if different than the gate dielectrice), planarized with dielectric 430 and then recessed, for example with an etchback process. Gate capping dielectric 155 is deposited, for example by CVD and planarized.

Returning to FIG. 3, method 301 continues at operation 340 where field plate patterning is performed and ILD etched back to a desired thickness. Any conventional photolithographic and etching process may be enlisted to recess the dielectric material(s) within the space between a gate electrode and dummy gate electrode to reach a desired EOT for the remaining dielectric. In further embodiments, etching at operation 340 also exposes one or more gate electrode surface or dummy gate electrode surface. In the exemplary embodiment illustrated in FIG. 4F, within the region not protected by sacrificial mask 432, dielectric 430 is etched back to form gate dielectric 130. Surfaces of both gate 150 and dummy gate 151 are also exposed. Adjustments to mask 432 may be made to expose only one surface (e.g., that of gate electrode 150), if desired. Alternatively, an etch having sufficient selectivity between dielectric 430 and at least one of dielectric spacer 121 and gate dielectric 140, and gate capping dielectric 155 may be utilized to avoid exposing either of gate electrode 150 or dummy gate electrode 151, if desired.

Returning to FIG. 3, method 301 continues at operation 345 where source and drain openings are patterned. Any known contact printing and/or etch process may be utilized at operation 345 to expose source and drain semiconductor regions in preparation for contact metallization. In the exemplary embodiment illustrated in FIG. 4G, a sacrificial mask 435 (e.g., a photosensitive mask or a hard mask) protects regions of dielectric material 430 (and field plate dielectric 130). Dielectric material 430 is etched through to expose the source and drain regions 107, 108.

Returning to FIG. 3, method 301 continues at operation 350 where contact metal(s) and field plate metal is deposited. Any deposition process known to be suitable for the desired contact metal may be utilized at operation 350. In the exemplary embodiment illustrated in FIG. 4G, a same metal, same stack of metals, or same mixture of metals is deposited as source metal 114, drain metal 115, and field plate electrode 135. A planarization process may be performed to expose gate capping dielectrics 155.

Completing description of FIG. 3, method 301 the ends with completion of an IC at operation 355, for example with the performance of backend processing that interconnects terminals of the extended-drain transistor formed thus far with other circuit elements, such as logic transistors, resistors, etc.

Notably, the extended-drain transistor architectures and techniques are amenable to forming high voltage (HV) CMOS circuitry enlisting a plurality of extended-drain transistors comporting with one or more of the embodiments described above. For example, a first NMOS extended-drain FET having a p-type channel region, n– doped extended-drain and n+ doped source and drain regions may be integrated into a circuit with a PMOS extended-drain FET having an n-type channel region, p– doped extended-drain and p+ doped source and drain regions. One or more of these FETs may further include a more lightly doped deep well (e.g., n-deep well in NMOS or p– deep well in PMOS).

Figure 5:
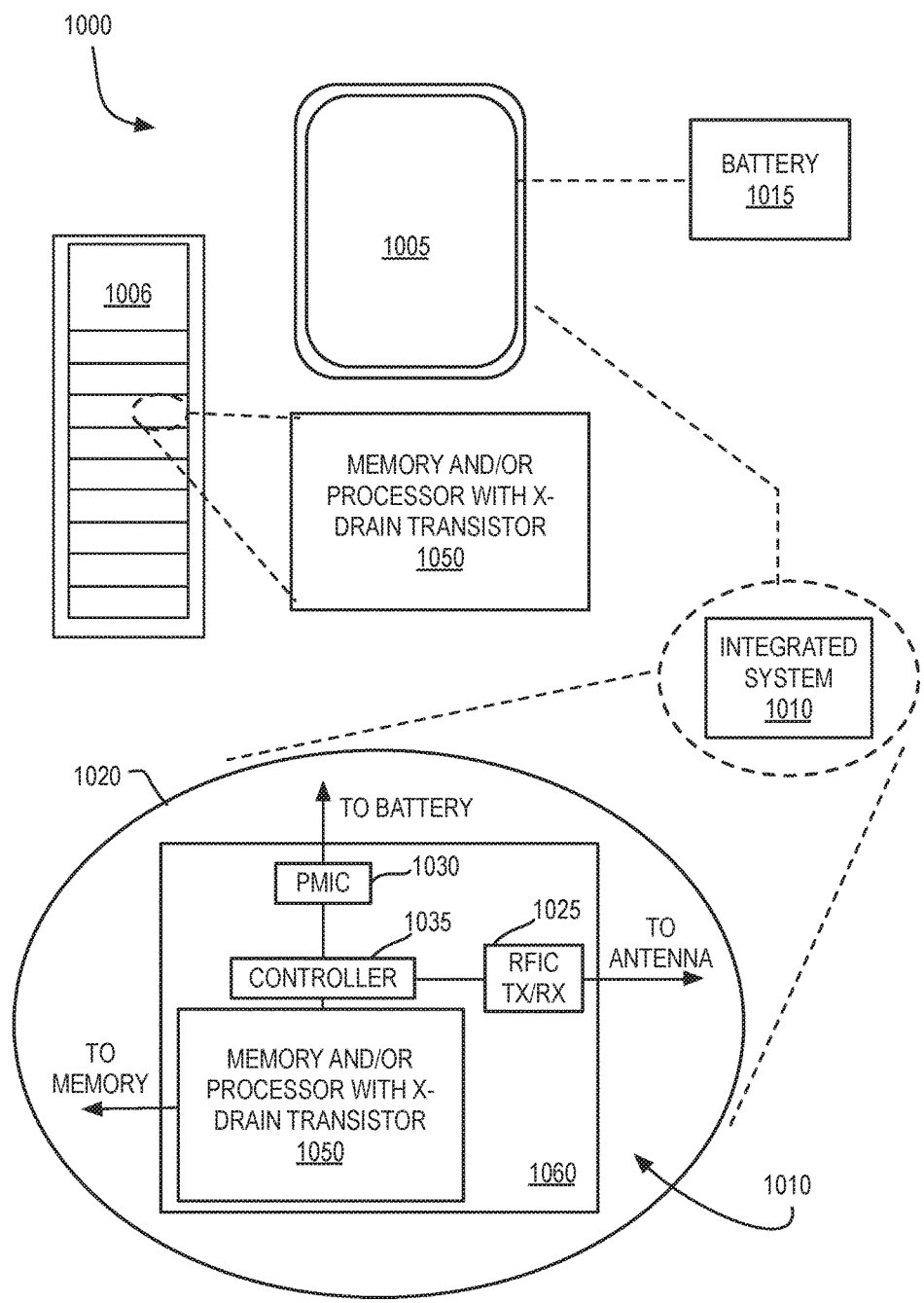
FIG. 5 illustrates a mobile computing platform and a data server machine employing an IC structure including a transistor with extended-drain structure, in accordance with embodiments of the present invention.

FIG. 5 illustrates a system 1000 in which a mobile computing platform 1005 and/or a data server machine 1006 employs an IC structure including one or more extended-drain transistor in accordance with one or more embodiment of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing an extended-drain transistor, for example as describe elsewhere herein. The monolithic IC 1050 may be further coupled to a board, a substrate, or integrated into a system-on-chip (SoC) 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply coupled to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050. In particular embodiments, at least one of a processor IC, memory IC, RFIC, or PMIC includes circuitry that incorporates an extended-drain FET having one or more of the structural features described elsewhere herein.

Figure 6:
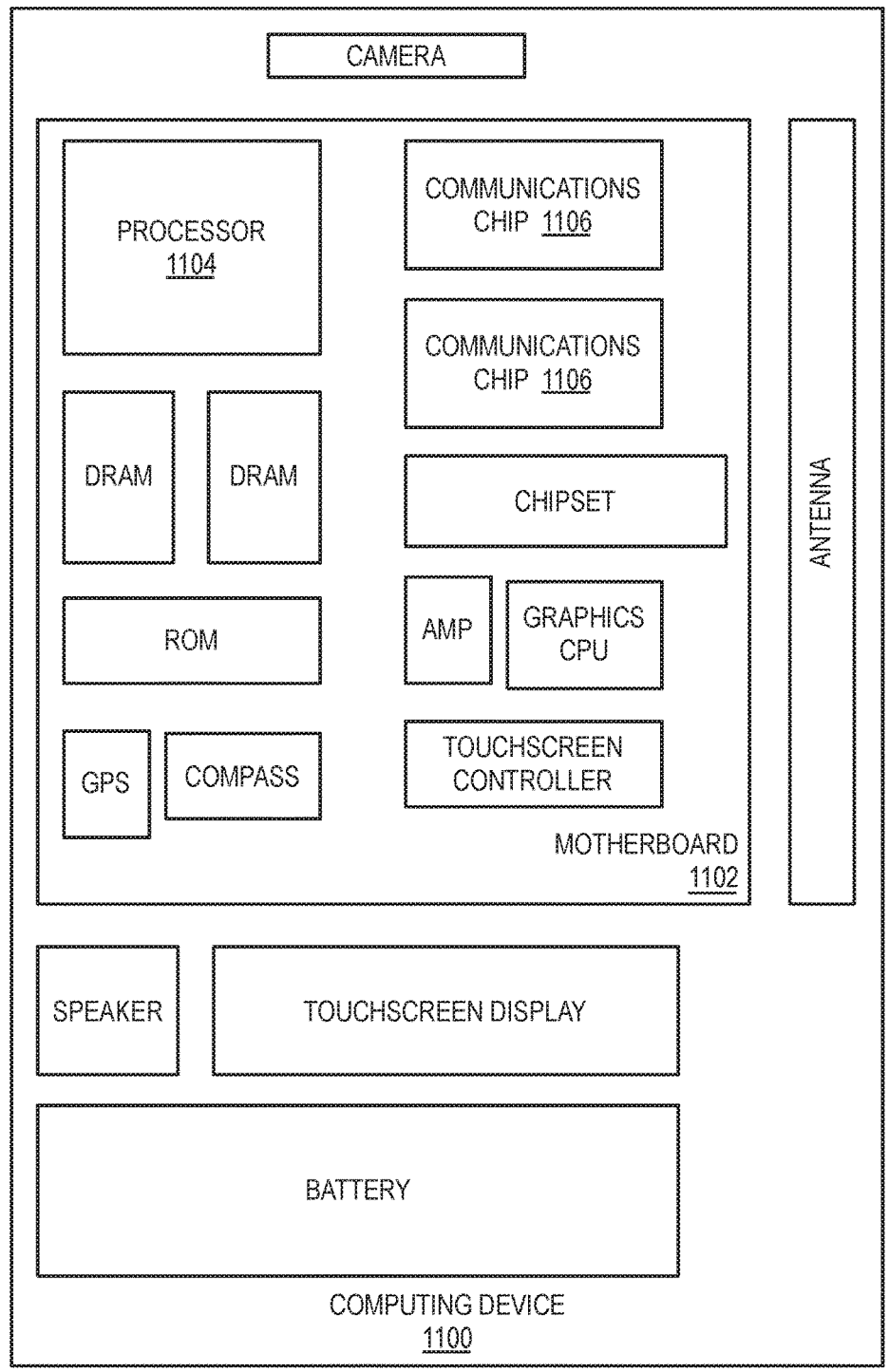
FIG. 6 is a functional block diagram of an electronic computing device, in accordance with an embodiment of the present invention.

FIG. 6 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate an extended-drain FET, in accordance with one or more embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, a touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiments, an extended-drain field effect transistor (FET) comprises a gate electrode disposed over a channel region of a semiconductor body with a gate dielectric disposed there between. The extended-drain FET includes a source contact metal coupled with a source region of the semiconductor body disposed on a first side of the channel region. The extended-drain FET includes a drain contact metal coupled with a drain region of the semiconductor body disposed on a second side of the channel region. The extended-drain FET includes a field plate electrode disposed over a doped extended-drain region in the semiconductor body between the channel region and drain region. The extended-drain FET includes a field plate dielectric disposed between the field plate electrode and the extended-drain region, and disposed in closer proximity to the gate electrode than to the drain contact metal.

In furtherance of the first embodiments, the source contact metal is spaced apart from the drain contact metal by at least twice a lateral length of the gate electrode. The field plate dielectric has a greater equivalent oxide thickness (EOT) than the gate dielectric. The field plate dielectric is spaced apart from the drain contact metal by at least one gate electrode lateral length.

In furtherance of the embodiment immediately above, the extended-drain FET further include a dummy gate electrode electrically isolated from the gate electrode and having substantially the same lateral length as the gate electrode, the dummy gate electrode disposed over the extended-drain region, and between the gate electrode and the drain contact. The field plate electrode is disposed between the gate electrode and the dummy gate electrode. The field plate electrode is electrically coupled to at least one of the gate electrode, dummy gate electrode, or the source contact metal.

In furtherance of the embodiment immediately above, the field plate electrode is in physical contact with the gate electrode. The field plate electrode is in physical contact to the gate electrode and the dummy gate electrode.

In furtherance of the embodiment above, a top surface of the field plate electrode is substantially planar with a top surface of both the source and drain contacts.

In furtherance of the embodiment immediately above, the field plate electrode has the same composition as both the source and drain contacts.

In furtherance of the embodiment above, the source contact metal and drain contact metal have substantially a same lateral contact length and define a contact metal pitch; and a lateral length of the field plate dielectric is substantially equal to the contact length and is disposed at one half the contact pitch.

In furtherance of the first embodiments, the extended-drain FET further comprises a deep doped well in the semiconductor body disposed between the doped extended-drain region and a complementarily doped semiconductor, wherein the deep doped well is doped to reduce drain-body capacitance.

In furtherance of the embodiment immediately above, the deep doped well is doped to the same effective conductivity type as the doped extended-drain region, but to a lower effective impurity concentration than the doped extended-drain region.

In furtherance of the embodiment above, the semiconductor body is a non-planar structure extending from a semiconductor substrate, and wherein the deep doped well is disposed at an interface of the non-planar structure and substrate.

In one or more second embodiments, an extended-drain field effect transistor (FET) includes a gate electrode disposed over a channel region of a semiconductor body with a gate dielectric disposed there between. The extended-drain FET further includes a source contact metal coupled with a source region of the semiconductor body disposed on a first side of the channel region. The extended-drain FET further includes a drain contact metal coupled with a drain region of the semiconductor body disposed on a second side of the channel region. The extended-drain FET further includes a field plate electrode disposed over a doped extended-drain region in the semiconductor body between the channel region and drain region. The extended-drain FET further includes a field plate dielectric disposed between the field plate electrode and the extended-drain region. The extended-drain FET further includes a doped deep well in the semiconductor body disposed between the extended-drain region and a complementarily doped semiconductor, wherein the deep well is doped to reduces drain-body capacitance.

In furtherance of the second embodiments, the deep well is doped to the same effective conductivity type as the extended-drain region, but to a lower effective impurity concentration than the extended-drain region.

In furtherance of the second embodiments, the field plate dielectric has a greater equivalent oxide thickness (EOT) than the gate dielectric. In furtherance of the second embodiment, the field plate dielectric is laterally spaced apart from the gate drain contact metal by a greater distance than from the gate electrode.

In one or more third embodiments, a method of fabricating an extended-drain field effect transistor (FET), the method comprises forming a doped extended-drain region within a semiconductor body disposed over a substrate. The method further comprises forming a source region and a drain region within the semiconductor body, the source and drain regions separated by a channel region and at least a portion of the extended-drain region. The method further comprises forming a gate dielectric disposed over a portion of the extended-drain region and the channel region. The method further comprises forming a gate electrode disposed over the gate dielectric. The method further comprises forming a field plate dielectric over the extended-drain region between the channel region and drain region in closer proximity to the gate electrode than to the drain region. The method further comprises forming a field plate electrode over the field plate dielectric. The method further comprises forming metal contacts over the source and drain regions.

In furtherance of the third embodiments, the method of fabricating the extended-drain FET in closer proximity to the gate electrode than to the drain region further comprises forming a dummy gate dielectric over a portion of the extended-drain region, forming a dummy gate electrode over the dummy gate dielectric, and depositing a low-k dielectric material in a space between the gate electrode and the dummy gate electrode. Forming the field plate electrode further comprises depositing a metal over the low-k dielectric.

In furtherance of the embodiment immediately above, depositing the low-k dielectric material further comprises depositing the low-k dielectric over the source and drain regions. Forming the field plate dielectric further comprises recessing the low-k dielectric material between the gate electrode and the dummy gate electrode to an equivalent oxide thickness (EOT) greater than that of the gate dielectric. Forming metal contacts over the source and drain regions further comprises removing the low-k dielectric material over the source and drain regions selectively to the low-k dielectric material disposed between the gate electrode and the dummy gate electrode, and depositing contact metal over the source and drain regions. Forming the field plate electrode further comprises depositing the contact metal over the low-k dielectric material between the gate electrode and the dummy gate electrode.

In furtherance of the third embodiments, the method further comprises recessing the low-k dielectric material between the gate electrode and the dummy gate electrode to expose the portion of at least one of the gate electrode and dummy gate electrode, and depositing the metal over the low-k dielectric further comprises depositing the metal in contact with the exposed portion of at least one of the gate electrode and dummy gate electrode.

In furtherance of the above embodiment, forming a doped deep well below the extended-drain region within a semiconductor body disposed over a substrate by implanting an impurity species to a deeper depth than the extended-drain region.

In furtherance of the embodiment immediately above, implanting the impurity species further comprises depositing a same species as that in the extended-drain region but to a lower effective impurity concentration.

In furtherance of the third embodiments, the method further includes forming the semiconductor body into a non-planar extension of the substrate. Forming the gate electrode and dummy gate electrode further comprises replacing a first sacrificial gate structure with the gate dielectric, the gate electrode over the gate dielectric, and a first dielectric cap over the gate dielectric. Forming the gate electrode and dummy gate electrode further comprises replacing a second sacrificial gate structure with the dummy gate dielectric, the dummy gate electrode over the dummy gate dielectric, and a second dielectric cap over the dummy gate dielectric. Forming the field plate dielectric further comprises recessing the low-k dielectric between the gate electrode and the dummy gate electrode to a level below the first and second dielectric cap. Forming the field plate electrode further comprises backfilling the recess between the gate electrode and the dummy gate electrode.

In one or more fourth embodiments, a system on a chip (SOC) comprises processor logic circuitry, memory circuitry coupled to the processor logic circuitry, RF circuitry coupled to the processor logic circuitry and including radio transmission circuitry and radio receiver circuitry, and power management circuitry including an input to receive a DC power supply and an output coupled to at least one of the processor logic circuitry, memory circuitry, or RF circuitry. At least one of the RF circuitry or power management circuitry includes an extended-drain field effect transistor (FET), further comprising a gate electrode disposed over a channel region of a semiconductor body with a gate dielectric disposed there between. The extended-drain FET further comprises a source contact metal coupled with a source region of the semiconductor body disposed on a first side of the channel region. The extended-drain FET further comprises a drain contact metal coupled with a drain region of the semiconductor body disposed on a second side of the channel region. The extended-drain FET further comprises a field plate electrode disposed over a doped extended-drain region in the semiconductor body between the channel region and drain region. The extended-drain FET further comprises a field plate dielectric disposed between the field plate electrode and the extended-drain region, and disposed in closer proximity to the gate electrode than to the drain contact metal.

In furtherance of the fourth embodiments, the extended-drain FET further comprises a doped deep well in the semiconductor body disposed between the extended-drain region and a complementarily doped semiconductor, wherein the deep well is doped to lower impurity concentration than the extended-drain region.

In furtherance of the fourth embodiments, the SoC includes the extended-drain FET in any of the above first embodiments.

However, the above embodiments are not limited in this regard and, in various implementations, the above embodiments may include undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An extended-drain field effect transistor (FET), comprising:
   a gate electrode over a channel region of a semiconductor body with a gate dielectric therebetween;
   a source contact metal coupled with a source region of the semiconductor body on a first side of the channel region;
   a drain contact metal coupled with a drain region of the semiconductor body on a second side of the channel region, wherein the source contact metal and drain contact metal have substantially a same lateral contact length;
   a field plate electrode over an extended-drain region in the semiconductor body between the channel region and the drain region; and
   a field plate dielectric between the field plate electrode and the extended-drain region, and in closer proximity to the gate electrode than to the drain contact metal, wherein the field plate dielectric has a lateral length that is substantially equal to the lateral contact length.

2. The extended-drain FET of claim 1, wherein:
   the source contact metal is spaced apart from the drain contact metal by at least twice a lateral length of the gate electrode;
   the field plate dielectric has a greater equivalent oxide thickness (EOT) than the gate dielectric; and
   the field plate dielectric is spaced apart from the drain contact metal by at least one gate electrode lateral length.

3. The extended-drain FET of claim 2, further comprising:
   a dummy gate electrode electrically isolated from the gate electrode and having substantially the same lateral length as the gate electrode, the dummy gate electrode over the extended-drain region, and between the gate electrode and the drain contact metal; and
   wherein:
   the field plate electrode is between the gate electrode and the dummy gate electrode; and
   the field plate electrode is electrically coupled to at least one of the gate electrode, dummy gate electrode, or the source contact metal.

4. The extended-drain FET of claim 3, wherein:
   the field plate electrode is in physical contact with the gate electrode; or
   the field plate electrode is in physical contact to the gate electrode and the dummy gate electrode.

5. The extended-drain FET of claim 3, wherein a top surface of the field plate electrode is substantially planar with a top surface of both the source and drain contact metals.

6. The extended-drain FET of claim 5, wherein the field plate electrode has the same composition as both the source and drain contact metals.

7. The extended-drain FET of claim 3, wherein:
   the source contact metal and drain contact metal define a contact metal pitch; and
   the field plate dielectric is disposed at one half the contact pitch.

8. The extended-drain FET of claim 1, further comprising:
   a doped deep well in the semiconductor body between the extended-drain region and a complementarily doped semiconductor, wherein the deep well is doped to reduce drain-body capacitance.

9. The extended-drain FET of claim 8, wherein the deep well has the same effective conductivity type as the extended-drain region, but to a lower effective impurity concentration than the extended-drain region.

10. The extended-drain FET of claim 8, wherein the semiconductor body is a non-planar structure extending from a semiconductor substrate, and wherein the deep well is at an interface of the non-planar structure and substrate.

11. An extended-drain field effect transistor (FET), comprising:
    a gate electrode over a channel region of a semiconductor body with a gate dielectric disposed there between;
    a source contact metal coupled with a source region of the semiconductor body on a first side of the channel region;
    a drain contact metal coupled with a drain region of the semiconductor body on a second side of the channel region;
    a field plate electrode over at least a portion of an extended-drain region in the semiconductor body, the extended-drain region having a lateral width separating the channel region from the drain region;
    a field plate dielectric between the field plate electrode and the extended-drain region; and
    a deep well in the semiconductor body disposed between the extended-drain region and a semiconductor of a conductivity type complementary to the deep well over the entire lateral length of the extended-drain, wherein the deep well has the same effective conductivity type as the extended-drain region, but a lower effective impurity concentration than the extended-drain region.

12. The extended-drain FET of claim 11, wherein:
    the field plate dielectric has a greater equivalent oxide thickness (EOT) than the gate dielectric; and the field plate dielectric is laterally spaced apart from the drain contact metal by a greater distance than from the gate electrode.

13. A method of fabricating an extended-drain field effect transistor (FET), the method comprising:
    forming an extended-drain region within a semiconductor body over a substrate;
    forming a source region and a drain region within the semiconductor body, the source and drain regions separated by a channel region and at least a portion of the extended-drain region;
    forming a gate dielectric over a portion of the extended-drain region and the channel region;
    forming a gate electrode over the gate dielectric;
    forming a field plate dielectric over the extended-drain region between the channel region and drain region in closer proximity to the gate electrode than to the drain region;
    forming a field plate electrode over the field plate dielectric; and
    forming metal contacts over the source and drain regions, wherein the metal contacts have substantially a same lateral contact length, which is substantially equal to a lateral length of the field plate dielectric.

14. The method of claim 13, wherein:
    forming the field plate dielectric over the extended-drain region in closer proximity to the gate electrode than to the drain region further comprises:
        forming a dummy gate dielectric over a portion of the extended-drain region;
        forming a dummy gate electrode over the dummy gate dielectric; and
        depositing a low-k dielectric material in a space between the gate electrode and the dummy gate electrode; and
    forming the field plate electrode further comprises depositing a metal over the low-k dielectric.

15. The method of claim 14, wherein:
    depositing the low-k dielectric material further comprises depositing the low-k dielectric over the source and drain regions;
    forming the field plate dielectric further comprises recessing the low-k dielectric material between the gate electrode and the dummy gate electrode to an equivalent oxide thickness (EOT) greater than that of the gate dielectric;
    forming metal contacts over the source and drain regions further comprises:
    removing the low-k dielectric material over the source and drain regions selectively to the low-k dielectric material disposed between the gate electrode and the dummy gate electrode; and
    depositing contact metal over the source and drain regions; and
    forming the field plate electrode further comprises:
    depositing the contact metal over the low-k dielectric material between the gate electrode and the dummy gate electrode.

16. The method of claim 14, wherein the method further comprises:
    recessing the low-k dielectric material between the gate electrode and the dummy gate electrode to expose the portion of at least one of the gate electrode and dummy gate electrode; and
    depositing the metal over the low-k dielectric further comprises depositing the metal in contact with the exposed portion of at least one of the gate electrode and dummy gate electrode.

17. The method of claim 13, further comprising:
    forming a doped deep well below the extended-drain region within a semiconductor body disposed over a substrate by implanting an impurity species to a deeper depth than the extended-drain region.

18. The method of claim 17, wherein implanting the impurity species further comprises depositing a same species as that in the extended-drain region but to a lower effective impurity concentration.

19. The method of claim 14, further comprising:
    forming the semiconductor body into a non-planar extension of the substrate; and
    wherein:
    forming the gate electrode and dummy gate electrode further comprises:
        replacing a first sacrificial gate structure with the gate dielectric, the gate electrode over the gate dielectric, and a first dielectric cap over the gate dielectric; and
        replacing a second sacrificial gate structure with the dummy gate dielectric, the dummy gate electrode over the dummy gate dielectric, and a second dielectric cap over the dummy gate dielectric;
    forming the field plate dielectric further comprises:
        recessing the low-k dielectric between the gate electrode and the dummy gate electrode to a level below the first and second dielectric cap;
        forming the field plate electrode further comprises backfilling the recess between the gate electrode and the dummy gate electrode.

20. A system on a chip (SOC), comprising:
    processor logic circuitry;
    memory circuitry coupled to the processor logic circuitry;
    RF circuitry coupled to the processor logic circuitry and including radio transmission circuitry and radio receiver circuitry; and
    power management circuitry including an input to receive a DC power supply and an output coupled to at least one of the processor logic circuitry, memory circuitry, or RF circuitry, wherein at least one of the RF circuitry or power management circuitry includes the extended-drain field effect transistor (FET) of claim 1.

21. The SOC of claim 20, wherein the extended-drain FET further comprises a doped deep well in the semiconductor body disposed between the extended-drain region and a complementarily doped semiconductor, wherein the deep well is doped to a lower impurity concentration than the extended-drain region.

* * * * *